United States Patent
Chen et al.

(10) Patent No.: US 8,551,851 B2
(45) Date of Patent: Oct. 8, 2013

(54) TITANIUM-BASED HIGH-K DIELECTRIC FILMS

(75) Inventors: Hanhong Chen, San Jose, CA (US); Pragati Kumar, Santa Clara, CA (US); Sunil Shanker, Santa Clara, CA (US); Edward Haywood, San Jose, CA (US); Sandra Malhotra, San Jose, CA (US); Imran Hashim, Saratoga, CA (US); Nobi Fuchigami, Sunnyvale, CA (US); Prashant Phatak, San Jose, CA (US); Monica Mathur, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 261 days.

(21) Appl. No.: 13/100,538

(22) Filed: May 4, 2011

(65) Prior Publication Data

US 2011/0203085 A1   Aug. 25, 2011

Related U.S. Application Data

(63) Continuation of application No. 12/494,702, filed on Jun. 30, 2009, now Pat. No. 7,968,452.

(51) Int. Cl.
*H01L 21/20* (2006.01)

(52) U.S. Cl.
USPC ....... 438/381; 29/25.4; 257/E21.09; 427/123; 427/249.19; 427/255.32; 427/255.37; 427/255.7; 438/399; 438/584; 438/591; 438/635; 438/656; 438/680

(58) Field of Classification Search
None
See application file for complete search history.

(56) References Cited

U.S. PATENT DOCUMENTS

| 5,508,242 A * | 4/1996 | Baumard et al. | 501/152 |
| 2007/0148897 A1 * | 6/2007 | Yeom et al. | 438/386 |
| 2007/0252244 A1 * | 11/2007 | Srividya et al. | 257/635 |
| 2008/0048225 A1 * | 2/2008 | Ahn et al. | 257/295 |
| 2008/0087890 A1 * | 4/2008 | Ahn et al. | 257/43 |

FOREIGN PATENT DOCUMENTS

KR   1020070106289   * 11/2007

OTHER PUBLICATIONS

Walker et al. ("Preparation and Characterization of High Surface Area Alumina—Titania Solid Acids", J. of Materials Science, 32, pp. 5583-5592, 1997).*
Lee, Translation of KR-10-2007-0106289.*

* cited by examiner

*Primary Examiner* — Yasser Abdelaziez

(57) ABSTRACT

This disclosure provides (a) methods of making an oxide layer (e.g., a dielectric layer) based on titanium oxide, to suppress the formation of anatase-phase titanium oxide and (b) related devices and structures. A metal-insulator-metal ("MIM") stack is formed using an ozone pretreatment process of a bottom electrode (or other substrate) followed by an ALD process to form a $TiO_2$ dielectric, rooted in the use of an amide-containing precursor. Following the ALD process, an oxidizing anneal process is applied in a manner is hot enough to heal defects in the $TiO_2$ dielectric and reduce interface states between $TiO_2$ and electrode; the anneal temperature is selected so as to not be so hot as to disrupt BEL surface roughness. Further process variants may include doping the titanium oxide, pedestal heating during the ALD process to 275-300 degrees Celsius, use of platinum or ruthenium for the BEL, and plural reagent pulses of ozone for each ALD process cycle. The process provides high deposition rates, and the resulting MIM structure has substantially no x-ray diffraction peaks associated with anatase-phase titanium oxide.

3 Claims, 8 Drawing Sheets

TITANIUM-BASED HIGH-K DIELECTRIC FILMS

RELATED APPLICATIONS

This application is a Continuation Application of and further claims the benefit and priority to U.S. Non-Provisional application Ser. No. 12/494,702 filed Jun. 30, 2009 and titled TITANIUM-BASED HIGH-K DIELECTRIC FILMS with a Notice of Allowance date of Apr. 15, 2011 which is herein incorporated by reference.

This document relates to the subject matter of a joint research agreement between Intermolecular, Inc. and Elpida Memory, Inc.

BACKGROUND

Industry continues to search for new dielectric materials that exhibit high K value (i.e. dielectric constant) and low leakage, to enable further miniaturization of electronic devices. These materials may be used as the dielectric layer in electronic components such as capacitors, memory cell structures, and other devices. The K value is a measure of the polarization capability of dielectric materials in response to external electrical field, which can be used to store charges in capacitors. The ability of a dielectric material to store charge is also conveniently represented by the equivalent oxide thickness ("EOT"). A low EOT implies an increased ability to miniaturize semiconductor devices. The leakage is a measure of the capacitor's capability to retain stored charge for a certain period of time. Both EOT and leakage are important parameters for the miniaturization of electronic components such as capacitors, memory cell structure and other devices.

Unfortunately, most dielectric materials investigated to date exhibit either high dielectric constant and high leakage, or low dielectric constant and low leakage. An example of such a material is presented by titanium oxide ($TiO_2$), which can yield high K value (often on the order of eighty or greater), but often also provides high leakage.

A need exists for ways to effectively make dielectric layers with high dielectric constant and low leakage. The present invention addresses these needs, and provides further, related advantages.

BRIEF DESCRIPTION OF THE DRAWINGS

FIG. 3 illustrates that the dielectric layer can be formed of a number of discrete monolayers or nanolaminates (307, 309, 311, 313 and 315), each deposited by an atomic layer deposition process (ALD). Each of these layers or nanolaminates can have titanium oxide such as layers 307, 311, 313 and 315 and, if desired, an occasional layer or nanolaminate (layer 313) can be optionally made to have a dopant, for example, yttrium oxide or aluminum oxide.

FIG. 16 indicates that the yttrium contribution for Y—Ti—$O_x$ films that provide good leakage density and EOT in an ALD process range from about one to five percent, with excellent results obtained for approximately 1-2% yttrium contribution to total metal.

FIG. 20, in particular, illustrates a memory cell 2001 including a cylinder-shaped capacitor 2021.

FIG. 21 illustrates a memory cell 2101 using a pillar- or pedestal-shaped capacitor 2121.

FIG. 22 illustrates a memory cell 2201 using a crown-shaped capacitor 2221.

DETAILED DESCRIPTION

Figure 1:
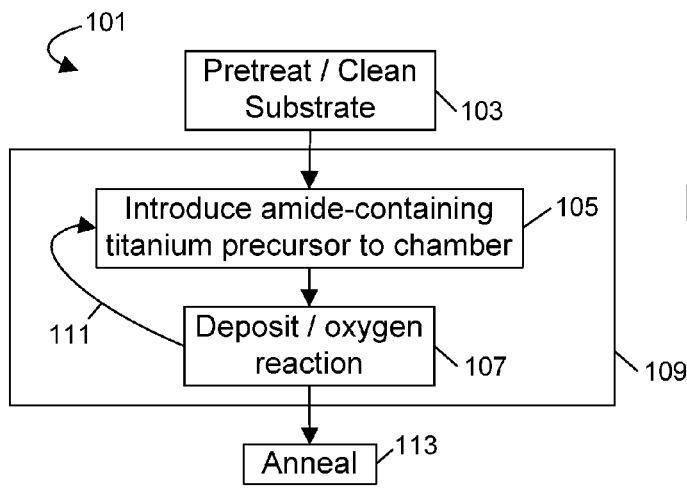
FIG. 1 is a flow chart of one embodiment of a method of forming a dielectric film.

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of forming a dielectric layer, namely, one having an oxide layer that includes titanium, and (ii) a method of forming such a dielectric for use in a metal-insulator-metal stack, for example, employed as a semiconductor stack, a capacitor, a DRAM cell, or similar structure. The invention, however, may also be applied to other methods and devices as well.

I. INTRODUCTION

Dynamic random access memory (DRAM) devices utilize one capacitor for storing one bit information. A cell capacitance (~25 F) and low leakage current at operation voltage ($10^{-7}$ A/cm² or $10^{-15}$ A/cell) is typically desired. As the feature size of semiconductor technology scales down aggressively, the cells used in DRAM devices are becoming smaller and smaller, dielectric materials with higher dielectric constant and lower leakage are sought. As mentioned previously, it is generally desirable to fabricate dielectric layers having a low effective oxide thickness ("EOT"), that is, as layers having high dielectric constant and low leakage. This disclosure provides (a) a titanium oxide layer aimed at these requirements, and at producing smaller DRAM devices, and (b) a method of creating such a layer.

Rutile form of titanium oxide is a promising candidate for these applications, since it has been demonstrated to possess a high K value (i.e., dielectric constant) on the order of 80 or greater. In practice, however, it is difficult to achieve this K value since anatase phase titanium oxide, which has K value of less than 40, generally dominates rutile phase titanium oxide during typical oxide formation processes. A target EOT value of less than 0.7 nanometers and leakage level of less than $10^{-7}$ Amps per square centimeter ("A/cm²") measured at 1.0 Volts are difficult to achieve in $TiO_2$ based materials. One of the reasons for this difficulty may have to do with the way titanium oxide is formed, e.g., one of its primary crystalline phases, anatase, generally has a low dielectric constant (on the order of 30-40).

This disclosure provides a process that has been found to yield a titanium oxide-based dielectric having high dielectric constant and low leakage. It is pertinent to the design of capacitors and similar structures, where the capacitance is measured according to the well-known formula $$C = \frac{A \cdot \varepsilon}{d} \quad (1)$$

where "A" represents area, "$\varepsilon$" represents K value, and "d" represents distance between capacitor plates; the smaller the thickness of dielectric needed to store a given charge, the greater the capacitance. Equivalent oxide thickness (EOT) is a measure of dielectric's capability to store charge, and is expressed for different materials using a normalized measure of silicon dioxide ($SiO_2$) as a reference $$EOT = \frac{3.9d}{K} \quad (2)$$

Where, d represents the physical thickness and K (or equivalently, $\varepsilon$) represents the K value (i.e., dielectric constant) of a material. Thus, the smaller the EOT a dielectric material can achieve at certain leakage level, the higher capability of the dielectric to store charges in associated components, including capacitor, DRAM cell, and so forth).

In one implementation described below, specific steps are employed to suppress the formation of the anatase phase of titanium oxide. It is believed that suppressing at least this crystalline phase during dielectric layer fabrication can lead to dielectric layers having the desired properties.

More specifically, the process methodology introduced below employs the following practices to achieve a dielectric layer having an EOT of less than 0.7 nm, a K value of greater than 80, and a leakage value approaching or less than $10^{-7}$ A/cm²:

(1) A substrate's surface (generally an exposed electrode) is pretreated with an oxidizer to remove surface contaminants and oxidize a thin skin of the exposed electrode;

(2) An atomic layer deposition ("ALD") process is used to grow a dielectric layer that includes titanium oxide; [ALD refers to a typically multi-cycle process used to deposit conformal layers with atomic scale thickness during semiconductor processing operations. ALD is generally regarded a multi-step, self-limiting process that includes the use of at least one precursor and at least one reagent, with the precursor establishing a thin conformal layer and with an in-situ reaction precipitated by introduction of the reagent terminating once the thin conformal layer or nanolaminate is formed; each reaction is one "cycle," with multiple cycles often being used to build a layer of any substantial thickness.]

(3) An amide-containing titanium precursor is used as part of the ALD process to grow the dielectric layer, with an oxygen source being used as the reagent to facilitate reactive formation of titanium oxide; An appropriate "reaction window" (i.e., a temperature window) may also be used during the ALD process, for example, via a pedestal heating to facilitate a reaction involving the selected amide-containing precursor and possibly help minimize formation of anatase phase titanium oxide; and (4) An anneal process is applied to the dielectric layer.

Specific exemplary materials that can serve as amide-containing titanium precursors include $Ti[N(C_2H_5CH_3)]_4$ ("TEMAT"), $Ti[N(CH_3)_2]_4$ ("TDMAT"), or $Ti[N(C_2H_5)_2]_4$ ("TDEAT"); other materials are also possible. Generally speaking, these specific materials feature a molecule rooted in a titanium atom with four bonds to nitrogen atoms, themselves connected to carbon-hydrogen groups. The term "amide" is well defined within the field of chemistry, and should be understood to encompass the above-referenced substances as well as others. The presence of nitrogen in the molecular structure for these precursors causes the titanium bonds to separate from nitrogen and react with oxygen in a manner that is different from other precursors, such as TTIP, helping minimize the formation of anatase phase titanium oxide.

It is believed that the use of specific temperature control within the appropriate reaction window, together with presence of nitrogen in the precursor structure, can cooperate to retard anatase phase formation and promote even lower EOT. In this regard, each precursor material will have an associated temperature range in which a reaction can proceed with acceptable deposition rates; proceeds with the selected oxygen source (typically oxygen gas, ozone gas, water vapor, a blend of nitrogen and oxygen gasses, or some other oxygen source); for TEMAT, the range is approximately 250-350 C, while for TDMAT and TDEAT, respectively, the ranges are approximately 150-300 C and 250-375 C. Within these windows, specific temperature variance can impact the K value, as will be described below in connection with FIGS. 13-14. In at least one described process, therefore, the temperature range is set to a specific value within the pertinent window so as to give higher K value and lower leakage. For TDMAT, for example, a pedestal temperature of at least 250 C was found to yield median K values of about 60 or greater, with pedestal temperatures of 284 C yielding median K values on the order of 100. The temperature control can be effectuated through pedestal heating or, in other implementations, other forms of process temperature control, but for several embodiments described below, will be accomplished using a combination of (a) a general reaction window of 100-375 C (as appropriate to the amide-containing precursor), and (b) a pedestal heating process that heats the substrate to around 275-300 C. Other temperatures and processes are also possible, i.e., especially if appropriate to the reaction window of an amide-containing precursor not listed above.

With respect to annealing, temperature can be selected within a range appropriate to specific materials. Generally speaking, the range is selected so as to enable the repair of defects in the deposited dielectric (e.g., filling oxygen vacancies), but not so great as to cause device shorting or damage to electrodes associated with the metal-insulator-metal ("MIM") structure; as this statement implies, the temperature range in at least some implementations is partially dependent upon the metal electrodes associated with the MIM structure. For example, when a ruthenium or ruthenium oxide electrode is used, a generally lower anneal temperature (e.g., less than 550 C, preferably 400 C-500 C) should be used, as higher temperatures spike electrode roughness and dramatically enhance leakage. For platinum electrode, by contrast, a higher temperature may be used (e.g., 550-650 C) to improve the effective energy barrier. It is believed that appropriate precursor selection, reaction temperature control, and anneal temperature control may all contribute toward lower EOT.

Further process particulars may also further contribute to a low EOT, high K value and low leakage.

For example, it has been found that surface pretreatment (or "cleaning" or "scrubbing" step) using an oxygen source can ultimately promote a higher K value on a consistent basis, at least for test samples employing platinum or ruthenium bottom electrodes. The oxygen source serves as an oxidizer which modifies substrate surface energy and improves chemical adherence of titanium vapor precursors used during the ALD process; it also removes contaminants from the substrate (e.g., electrode). Ozone or nitrous oxide ($N_2O$) can be used as the oxygen source for these purposes, applied in concentration and time sufficient to oxidize a thin, top layer of the substrate.

Specific materials used in connection with the principles described above may also contribute to improved results. For example, titanium oxide can be doped to further enhance K value or leakage characteristics; yttrium oxide ($Y_2O_3$) or aluminum oxide ($Al_2O_3$) or other materials can be used for this purpose, with an ALD process interleaving dopant nanolaminates or monolayers among plural titanium oxide layers (e.g., in a 4-5:1 or similar ratio). Specific electrode materials may also contribute to desirable device properties, with specific examples presented below based on the use of Ruthenium (Ru) or Platinum (Pt) for the bottom electrodes; as alluded to above, an annealing temperature may be at least partially chosen in dependence upon the selected of the electrode materials.

Using the principles presented above, a MIM stack may be fabricated to have excellent EOT characteristics and low leakage. As will be more fully described below, such a stack may be used as part of a capacitor, DRAM cell or device, or other electronic structure. In connection with the discussion below, FIGS. 1-3 will be used to introduce the aforementioned method steps and a MIM structure that exemplifies the principles just introduced. FIGS. 4-17 will be used to explain specific processes and structures that implement these principles, and data on the success of resulting structures. Finally, FIGS. 18-22 will be used to describe exemplary capacitor and DRAM structures that can be built using these principles.

Notably, the term "MIM" as used herein should be understood to encompass any combination of layers that utilize a dielectric with two electrodes, whether or not additional layers are present; for example, the term "MIM" should be understood to encompass metal-insulator-insulator-metal, metal-insulator-insulator-insulator-metal, metal-insulator-metal-insulator-metal and other, similar structures, with or without further insulators, enhancement layers, smoothing or adherence layers or other structures between them (e.g., to promote adherence of other layers). An oxide "layer" should be understood to refer to either (a) the entire dielectric layer, which may consist of a single layer or one or more "monolayers" that together cooperate to form the dielectric layer, as well as (b) individual monolayers, e.g., an oxide of titanium, yttrium/aluminum, or both. Thus, a "layer" may refer to a single layer, to an aggregate combination of layers, or to one monolayer. The term "monolayer" should be understood to refer to a single layer of a relatively homogeneous composition (i.e., one or more materials), while a "nanolayer" or "nanolaminate" layer refers to a thin deposition that may achieve sparse or complete layer coverage—for example, a single ALD cycle may be used to deposit a nanolayer or nanolaminate. The "substrate" may be any material capable of supporting a layer of semiconductor material, and may include a metal conductor, insulator, glass, previously deposited layer (dielectric, nanolaminate or otherwise) or another material, but generally in this disclosure will refer to a metal electrode mounted above a $SiO_2$ or other base. "Preparation," "treatment" or "pretreatment" of a layer typically includes cleaning a substrate to promote good adhesion between a to-be-deposited layer and the substrate, and to otherwise ready the substrate's surface for a semiconductor deposition. The use of "reactive" in the context of a reactive process refers to the formation of a metal oxide layer by using metal containing substances that react at the time of layer fabrication with oxygen-containing substances (e.g., gasses or precursors). For example, in the ALD context, a reactive process may be one that uses a metal precursor as a source of titanium and/or other materials (such as a metal dopant), and an oxygen source (e.g., ozone, water vapor, oxygen) to form in situ a metal oxide. Finally, it should generally be noted that when the term "ozone" is used in this disclosure, it is being used not to necessarily require "pure, 100%" ozone—that is, generally speaking, ozone is typically not used in pure form, i.e., it is typically mixed with other gasses such as oxygen in an approximately 1/5 ratio, and that such a mixture is typically the instantiation of "ozone" in the specific processes advanced by this disclosure.

Figure 2:
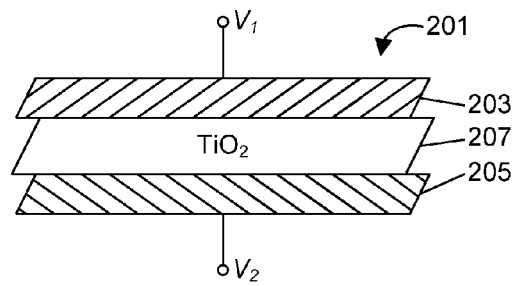
FIG. 2 is a cross-sectional view of a capacitive device having two conductors and a dielectric film or "layer" formed according to principles provided by this disclosure.
Figure 3:
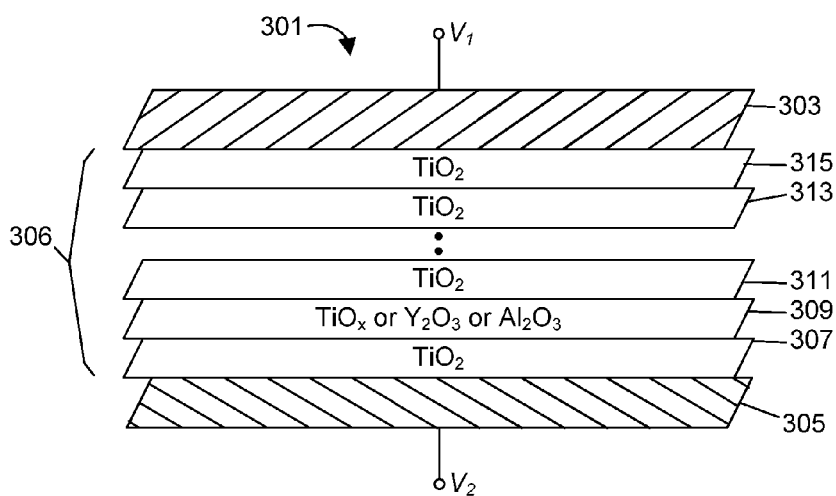
FIG. 3 is another cross-sectional view of a capacitive device having two conductors and a dielectric layer.

With some of the benefits of the methods and structures presented herein thus introduced, additional detail will now be presented regarding an exemplary MIM stack, with reference to FIGS. 1-3.

II. AN EXEMPLARY MIM STACK

In a process implementation described below, specific steps are employed to suppress the formation of the anatase phase of titanium oxide. It is believed that suppressing this crystalline phase can be used to facilitate dielectric layers having the desired properties.

FIG. 1 illustrates a method 101 by which an oxide layer may be formed. In particular, a substrate upon which materials are to be deposited is first prepared and pretreated as indicated by function block 103. The pretreatment is typically performed in an ALD chamber and involves cleaning the surface of a substrate (e.g., the bottom electrode top surface) to promote better adhesion; as mentioned, it has been found that excessive contaminants may inhibit low leakage and low equivalent oxide thickness ("EOT"). [It should be recalled that it is desired generally to produce materials having low leakage and low EOT so as to facilitate continued miniaturization of electronic devices, including without limitation memory devices.] Contaminants may impart inconsistencies in a dielectric (e.g., a metal oxide layer) where the goal is to have a small, consistent thickness of that oxide layer. Therefore, the pretreatment step in at least some implementations below not only "cleans" the substrate, but it also promotes better adhesion and a more consistent thin-dielectric layer behavior. It is also believed that the use of an oxidizer can enhance this process, i.e., where the substrate is a metal electrode, the use of an oxidizer in the pretreatment process oxidizes the electrode to a thin depth, which may also promote better adhesion, help passivate the electrode, and impart other desirable properties. Additional details on the use of desirable pretreatment agents and other pretreatment particulars will be presented below.

With a substrate pretreated, as appropriate, a dielectric layer may then be deposited, as indicated by numeral 105. In the present example, it should be assumed that a MIM stack will be formed (such as will be described below in connection with FIG. 2); to this end, an insulator or dielectric is deposited in an ALD process as a number of layers or nanolaminates that will collectively form a dielectric layer. These layers or nanolaminates may be configured for example as layers of a single compound or as co-injected layers. Each of these layers may include a metal oxide (i.e., they typically all do, although it is possible to deposit various other functional layers depending on the type of process and application—such additional layers can be smoothing layers, adhesion layers, non-insulator layers, barrier layers, and other types of structures). Depending on application, these may all form a part of (and be considered a part of) the "MIM" structure, which simply requires that an insulator be between two electrodes (e.g., thereby forming a capacitor).

As alluded to earlier, it is desired to promote low leakage and low EOT and, to this effect, a high k value (high dielectric constant) is desirable—in the embodiment of FIGS. 1-3, titanium oxide (doped or un-doped) is used for this purpose. That is to say, for at least part of the insulator or dielectric layer, titanium oxide will form a primary constituent. A number of materials and processes may be used to form titanium oxide, such as physical vapor deposition ("PVD") processes or the use of titanium tetra-isopropoxide (TTIP) as a precursor in an ALD process, but for purposes of this disclosure, it has been found desirable to use an ALD process with a specific type of precursor, that is an amide-containing precursor, as providing synergistic results. As will be demonstrated below, use of an amide-containing precursor helps suppress the formation of the anatase phase in titanium oxide and it thus leads to a better EOT characteristic and lower leakage. The use of an amide-containing precursor also promotes significant higher deposition rates, and thus significantly lowers cost of a semiconductor manufacturing process (cost is, generally speaking, heavily influenced by deposition rates). These process features are indicated by numeral 105 in FIG. 1. With the adherence of a thin, conformal layer of precursor, a reagent (i.e., an oxygen source) is then introduced into the ALD chamber, and the process repeated, to grow as many monolayers or nanolaminates as desired. [A typical nanolaminate, depending on materials, may be half of an Angstrom in thickness, so ALD cycles are repeated to form layers having the thickness desired for the application.] The use of an oxygen source is represented by numeral 107 in FIG. 1, with each cycle of an ALD process (i.e., precursor plus reagent) represented by numerals 105 and 107 together. The use of multiple cycles, i.e., so as to grow the desired dielectric, is represented in FIG. 1 by a dashed-line process box 109 and a feedback arrow 111.

When combined with enhanced consistency from pretreatment (e.g., via pretreatment 103, and/or annealing 113, discussed below), the use of an amide-containing precursor (box 105) helps bring together both desirable EOT and reduced leakage in a single design.

Function box 113 represents the use of annealing in an oxygen ambient, e.g., the use of a rapid thermal oxidation ("RTO") process, furnace oxidization or similar process. An oxidizing anneal may be useful for many applications, because the deposition process (whether PVD or ALD or otherwise) may deposit a dielectric layer having defects (such as oxygen vacancies in the titanium oxide structure). These defects enhance leakage, and therefore provide room for improvement. The presence of interface states of the electrode and titanium oxide also help reduce the effective energy barrier height of the $TiO_2$/electrode interface, leading to higher Schottky emission leakage. The annealing process can reduce the concentration of interface states and improve the energy barrier height, effectively blocking the Schottky emission. However, the use of such an anneal process alone has been found to reduce the dielectric constant of titanium oxide at temperature such as above 600 C and thus increase the EOT of devices that rely on titanium oxide as part of their dielectric layer. It is believed that the use of the amide-containing precursor in an ALD process helps overcome this difficulty. A sufficient temperature and duration should be used in the anneal environment in order to obtain the benefits of annealing (typically above 400 C); however, as mentioned, for the materials used to form the MIM stack, too high of a temperature may cause deformation of a bottom electrode layer in the MIM structure, so the anneal temperature should not be too high (this deformation can degrade leakage current as the deformation increases random surface roughness). A specific temperature window is therefore ideally chosen based on the characteristics of at least one of the electrodes (or metals) of the MIM structure—for two specific electrode materials in particular, namely, for platinum and ruthenium, the temperature window may be 550-650 C and 400-500 C, respectively.

As alluded to above, an oxide layer made according to the principles presented in this disclosure may be used to fabricate electronic devices. FIG. 2 illustrates one such device 201, namely, a capacitor. A capacitor is an electronic device with two conductive leads, each of which connects to a conductive plate, and a dielectric material between the plates; the capacitor is operated to store charge (i.e., $V_1$-$V_2$) between the plates, across the dielectric material. In FIG. 2, these two conductive plates are indicated by reference numerals 203 and 205, and are illustrated as separated by a $TiO_2$ dielectric layer 207. By manufacturing devices utilizing such a material, given its relatively high dielectric constant and low leakage, electronic devices (such as the capacitor depicted by FIG. 2) may be fabricated on an increasingly small basis, with a lower minimum layer thickness limitation for separating charge plates 203 and 205. [For purposes of comparison, aluminum oxide ($Al_2O_3$, a conventional primary dielectric material used for DRAM capacitor applications) has a dielectric constant of approximately 9, compared to dielectric constant of 40, 60 and potentially even higher for the materials presented by this disclosure. Thus, while providing comparable leakage to aluminum oxide, the materials provided by this disclosure present the possibility of facilitating significant additional miniaturization improvements through increased charge storage density.]

FIG. 3 depicts another embodiment of a capacitive device 301, namely, one manufactured using an atomic layer deposition ("ALD") process. As shown in FIG. 3, a capacitor may include two conductive layers 303 and 305 which together sandwich a dielectric region 306. To store charge on the device, a voltage potential is applied to each conductive layer 303 and 305 via a set of nodes, i.e., as indicated by the two depicted voltages, $V_1$ and $V_2$. The dielectric region, in turn, is seen to include a large number of individual monolayers or nanolaminates 307, 309, 311, 313 and 315; each layer may be an amorphous, discrete titanium dioxide ($TiO_2$) monolayer or nanolaminate—if desired, a dopant or co-injected monolayer or nanolaminate may be dispersed every X depositions of the primary material ($TiO_2$), as suggested by text associated with monolayer or nanolaminate 309. To provide an example, a dopant of yttrium oxide or aluminum oxide may be used in a 2:9 ratio with respect to titanium oxide layers (e.g., ordered as 4 nanolaminate depositions of $TiO_2$, a dopant nanolaminate, 5 nanolaminate depositions of $TiO_2$, and so forth). While only five depositions are depicted in FIG. 3, it should be noted that any number can be used and the number chosen depends upon dielectric layer materials and desired thickness of a fabricated device; for example, one embodiment of such a device features a total dielectric thickness in range of 5-10 nm to achieve an appropriate level of capacitance while minimizing leakage. By creating individual, reacted, atomic scale nanolaminates in this manner, each as part of an ALD "cycle," a dielectric region may be built up to theoretically any desired thickness. As mentioned, a typical thickness per ALD cycle may be on the order of one-half Angstrom so that, for example, one hundred cycles might be used to create a dielectric region having a five nanometer thickness.

Notably, as with all FIGS. in this disclosure, the depicted size and thickness of layers, including relative dimensions, should be read as illustrative only.

With the presentation of a MIM stack thus introduced, additional detail regarding process will now be presented.

Figure 4:
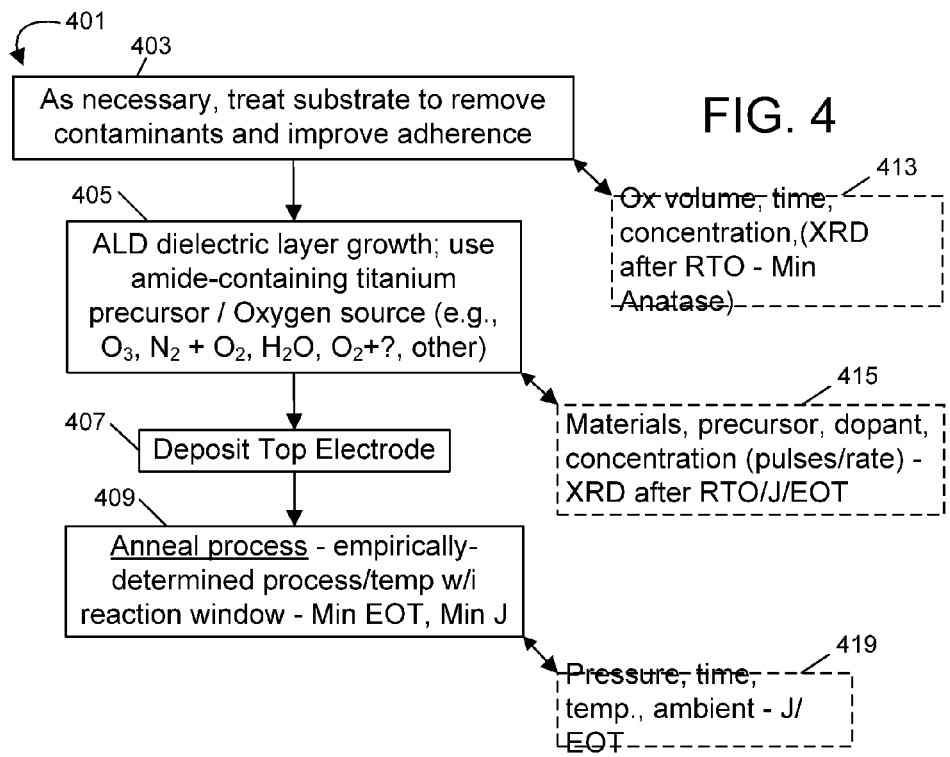
FIG. 4 is a block diagram illustrating process steps for fabricating a titanium oxide dielectric layer to have good equivalent oxide thickness ("EOT") and low leakage characteristics; dashed boxes 413, 415 and 419, at the right side of FIG. 4, list additional process considerations that may be used for some designs.

FIG. 4 presents a flow diagram 401 that includes four basic processes 403, 405, 407 and 409 for fabricating a MIM stack with desired EOT and minimal leakage characteristics. In particular, it has been found that surface contaminants can negatively impact a low leakage current and low EOT. To this effect, step 403 calls for, as necessary, treating a substrate surface with ozone.

One exemplary device includes a standard silicon dioxide base ($SiO_2$) layered with a metal electrode. The electrode may be formed of one or more materials, for example, one or more metals or another form of conductor. Suitable electrode materials may include titanium nitride (TiN), platinum, iridium, iridium dioxide, tungsten, tungsten dioxide, molybdenum, molybdenum dioxide, ruthenium and ruthenium dioxide. In the specific embodiments discussed in this disclosure, the bottom electrode ("BEL") is typically composed of a single material, typically platinum or ruthenium. The use of a scrubbing agent that is also an oxidizer (e.g., ozone or nitrous oxide) is advantageous in that it helps oxidize a thin top layer of the electrode, thereby promoting stability of the electrode/dielectric layer, adhesion characteristics, and other desired properties. A typical pretreatment process can last anywhere from 1-1000 seconds, but typically saturates at some point, where the surface characteristics become acceptable to generate a dielectric layer having the desired properties (e.g., EOT<1 nm and leakage less than $10^{-7}$ A/cm$^2$ measured at 1.0 Volts); in connection with the empirical measurements discussed below, it has been found that under supply pressure, a continuous pulse of approximately 10 seconds (flow rate ½ liter per minute) yielded adequate results, but one skilled in the art should empirically adjust flow rate and duration to be sufficient (given specific deposition materials and environment).

Once the substrate has been pretreated, an ALD process is then applied, as represented by numeral 405, to grow a dielectric layer based upon one or more monolayers or nanolaminates. As introduced above, a titanium oxide layer having superior dielectric properties is obtained using an amide-containing titanium precursor, reacted with a source of oxygen such as ozone, a nitrogen gas/oxygen gas mixture, water vapor, or some other oxygen source, layered in one or more ALD cycles. Especially with proper temperature controls, the amide-containing precursor helps produce a film having a suppressed anatase phase titanium oxide; it has been found that suppressing anatase formation correlates with higher dielectric constant and, thus, the potential to obtain lower EOT. Taken in connection with appropriate surface pretreatment and the anneal processes described below, a dielectric film of consistent thickness can be produced with superior dielectric properties and reduced leakage.

As indicated by a third step 407, a top electrode ("TEL") is then added to complete the MIM structure. This electrode can be any conductive material as mentioned above, but for some applications, it may be desirable to use the same metal as used for the bottom electrode, e.g., platinum or ruthenium.

Finally, as indicated by step 409, an oxidizing anneal process is then performed to repair defects in the dielectric film. Performed at the proper temperature in an oxidizing environment, the anneal process can fill oxygen vacancies in the dielectric structure and eliminate most interface states between the dielectric and electrodes; however, too high a temperature has been found to degrade device performance by damaging surface roughness consistency. The anneal process is therefore performed for a specific amount of time (e.g., 10 min) within a specific temperature window (450-500 C where Ruthenium electrodes are used, and 550-650 C where Platinum electrodes are used). The anneal process therefore may be closely linked to the pretreatment process described in this disclosure, in order to ensure low surface roughness and thereby promote a consistent dielectric layer thickness throughout the ultimate MIM structure.

FIG. 4 also indicates a number of process variants in phantom lines, 413, 415 and 419, one for each of the first, second and fourth steps mentioned above (403, 405 and 409). For example, scrubbing agent identity (i.e., an oxygen source such as ozone or nitrous oxide, or another oxygen source), scrubbing agent pressure, time, flow rate, volume, and the role of the anneal may all play a role in shaping process specifics. For the ALD process, variations include choice of materials (precursor, reagent) and also whether the titanium oxide layer will be doped. To provide one example, it has been found that a dopant in small quantities (e.g., yttrium oxide, with yttrium representing 1-5 atomic percentage of total metal) may further promote better dielectric constant and lower leakage; other dopants may also be used. There also are choices of suitable reagent, and as will be presented further below, it is generally believed that ozone may yield suitable results, with advantages gained through repeated ozone application between ALD cycles (e.g., where a platinum bottom electrode is used). The number of ALD cycles, material leakage, desired device properties, and desired anneal process all play a role also in helping shape ALD materials, temperatures and other deposition parameters. Finally, as indicated by phantom box 419, pressure, time, temperature, materials used, and other environmental factors also play a role in shaping the anneal process.

III. PRETREATMENT

Figure 5:
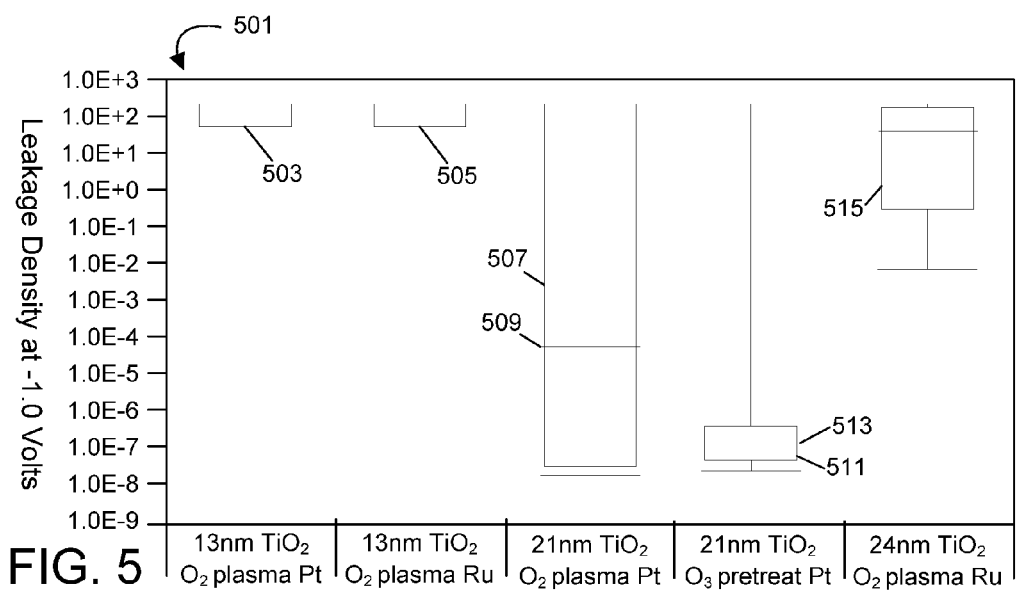
FIG. 5 is a statistical distribution diagram 501 that plots leakage density for various oxidation processes, including processes that use water vapor as an oxygen source and a process that uses ozone gas as an oxygen source. As mentioned earlier, low leakage is desired, and what FIG. 5 helps demonstrate is that, of the processes represented, the process involving ozone helps provide significantly better leakage characteristics than similar processes involving other oxidants.

FIG. 5 presents data on pretreatment agent used to scrub a substrate's surface (i.e., the metal electrode surface). As with many of the process referenced in this disclosure, specifics will vary for materials used, application, process chambers and other factors; empirical measurements should be performed to arrive at specific control points using the teachings provided by this disclosure. FIG. 5 presents statistical data for leakage density for various MIM capacitors, each having either platinum or ruthenium as an electrode material, and each fabricated using an ALD process to deposit a $TiO_2$-based dielectric layer. For the represented capacitors, each dielectric layer was fabricated using TTIP as the titanium source, oxygen gas to pretreat the deposition surface, and water or ozone as the titanium and oxygen reagent source. A graph 501 shows data for five dielectric material/electrode combinations, including (a) a 13 nanometer $TiO_2$ layer, using water as the reagent and a platinum electrode (data represented by a box 503), (b) a 13 nanometer $TiO_2$ layer, using water as the reagent and a ruthenium electrode (data represented by a box 505), (c) a 21 nanometer $TiO_2$ layer, using water as the reagent and a platinum electrode (data represented by a box 507), (d) a 21 nanometer $TiO_2$ layer, using ozone gas as the reagent and a platinum electrode (data represented by box 511), and (e) a 24 nanometer $TiO_2$ layer, using water as the reagent and a ruthenium electrode (data represented by a box 515). Each box 503, 505, 507, 511 and 515 represents the bulk of data points associated with a standard deviation about a mean (e.g., with the mean represented by lines within certain boxes, such as indicated by numerals 509 or 513, respectively). Generally speaking, it is desired to produce low leakage devices in a repeatable manner, such that the more consistent the data (i.e., the "shorter" the box represented by a standard deviation about each mean) and the lower the box's height on the graph, the better the reproducibility of the leakage characteristics. As indicated by FIG. 5, data for most materials lies at the top end of the graph 501 (representing relatively high leakage density) with the standout being the process (d), associated with the use of ozone in lieu of water as the oxidant. The results in fact show dramatically lower leakage and consistently low leakage when ozone is used as the reagent; thus, of the mentioned oxygen sources for use as an ALD reagent and scrubbing agent, it is believed ozone has the potential to give superior results for many applications.

Figure 6:
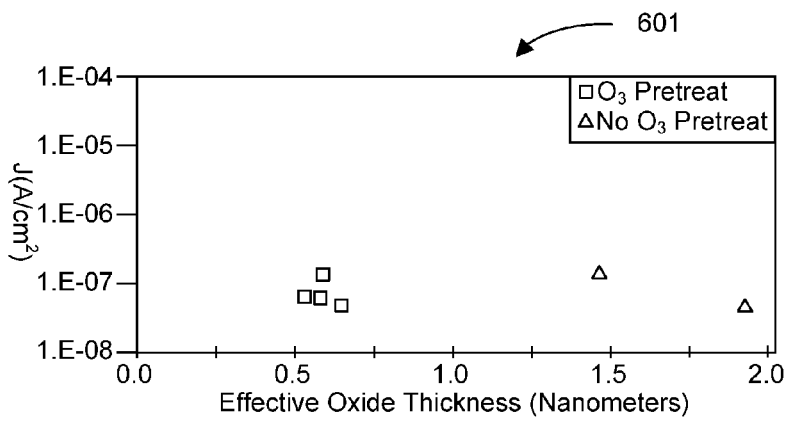
FIG. 6 presents a graph 601 used to assess the impact of pretreatment on leakage and EOT characteristics.

FIG. 6 further expounds on this data, providing a graph 601 that compares samples with ozone pretreatment versus samples not having ozone pretreatment. The ozone pretreated samples, with a ruthenium bottom electrode, were processed using a ½ liter flow rate of a 20% ozone to oxygen mixture for approximately ten seconds, and are represented by small squares at the left-side of FIG. 6; by contrast, samples having no pretreatment are represented by small triangles at the right-hand side of FIG. 6. What FIG. 6 helps demonstrate is that while all samples are indicated to have similar leakage, the pretreated samples have significantly lower EOT, between 0.5 nm and 0.6 nm, well under the desired goal of 0.7 nm. By contrast, the samples having no pretreatment were generally measured to have an EOT at about 1.5 nm or higher, well outside the desired range.

IV. USE OF AN AMIDE-CONTAINING PRECURSOR AND THE ALD PROCESS

1. General Principles.

Figure 7:
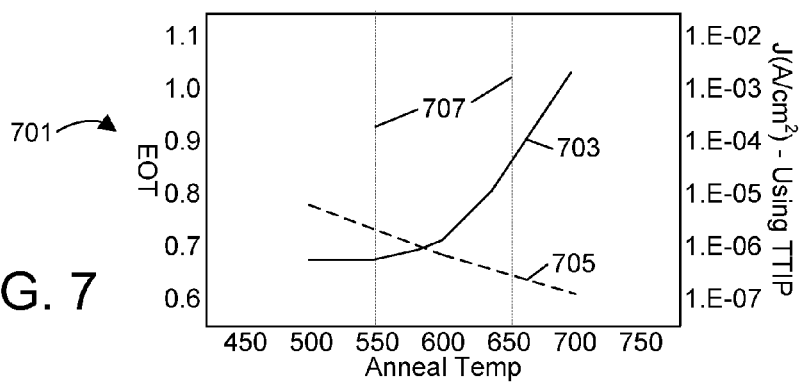
FIG. 7 shows a graph 701 that plots leakage and EOT for tetrakis isopropoxide (TTIP), a non-amide titanium precursor, as a function of anneal temperature. In particular, EOT is plotted using a solid line 703, while leakage is plotted using a dashed line 705. As highlighted by two vertical range lines 707, the best reconciliation between diverging EOT and leakage characteristics is found at the anneal temperature range of about 550 C to 650 C.

FIG. 7 presents a graph 701 for a titanium oxide dielectric made using tetrakis isopropoxide (TTIP), a non-amide titanium precursor, above a platinum bottom electrode. For TTIP, EOT is plotted using a solid line 703, while leakage is plotted using a dashed line 705. As highlighted by two vertical range lines 707, the best reconciliation between diverging EOT and leakage characteristics is found using an approximate anneal temperature range of about 550 C to 650 C (at least where a platinum bottom electrode is used). Notably, the leakage indicated by FIG. 7 is on the order of $10^{-6}$ A/cm$^2$, which is greater than the desired goal of $10^{-7}$ A/cm$^2$.

Figure 8:
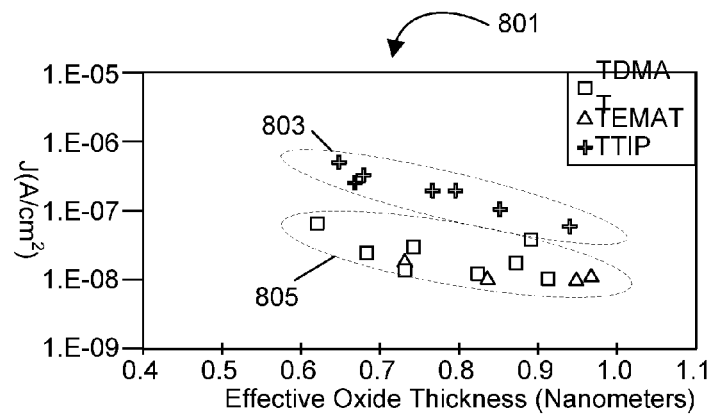
FIG. 8 shows a graph 801 that plots leakage and EOT for tetrakis isopropoxide (TTIP), a non-amide titanium precursor, as well as for two amide-containing precursors, namely, tetrakis dimethylamino titanium ("TDMAT") and tetrakis (ethylmethylamino) titanium ("TEMAT"). Data for each of the two groups of precursors are fairly well separated, with a first ellipse 803 identifying data associated with TTIP and a second ellipse 805 identifying data associated with the amide-containing precursors. In particular, each of the precursors is seen to yield similar EOT characteristics, with the amide-containing precursors producing significantly lower leakage.

FIG. 8 further expands on this data, showing the effects of different titanium precursors upon what are otherwise similar process samples. In this regard, FIG. 8 presents data 801 that contrasts leakage obtained using amide-containing precursors (TDMAT and TEMAT, represented by small squares and triangles, respectively) and TTIP (represented by crosses). In particular, whereas the pretreatment process discussed above seemingly had a profound impact on EOT but not leakage, the use of the amide-containing precursor is seen to have a profound effect on leakage but not necessarily EOT (i.e., with an amide-containing precursor, a range of EOTs is obtained).

Two different data sets are encircled in FIG. 8, with a first data set 803 representing non-amide-containing precursors (e.g., TTIP) and a second data set 805 collectively representing the amide-containing precursors—as should be apparent, the use of the amide-containing precursors has potential to drop leakage a full order of magnitude below that observed for TTIP—at or near the desired range of $10^{-7}$ A/cm$^2$. Thus, the combination of the pretreatment with the use of amide-containing precursors shows potential to help minimize each of EOT and leakage toward the desired goals of EOT<0.7 nm and leakage<$10^{-7}$ A/cm$^2$.

As indicated above, the precursors are used in an atomic layer deposition or "ALD" process. This term refers to a process used to deposit conformal nanolaminates with atomic scale thickness during semiconductor processing operations. ALD may be used to deposit barrier layers, adhesion layers, seed layers, dielectric layers, conductive layers, etc. ALD is generally regarded a multi-step, self-limiting process in the sense that a reaction terminates once a transferred material is consumed by the one or more reagents. Generally, a first material (e.g., titanium precursor or oxygen source) is first introduced into a processing chamber and adhered to a substrate. Excess material is then purged or pumped away, as appropriate, and then a second material (e.g., oxygen source or titanium precursor) is then introduced into the chamber, to react with the first material. Formation of a complete assembly using the aforementioned steps constitutes one deposition (or ALD cycle), and the process can then be repeated as necessary to form additional nanolaminates or monolayers, with the number of cycles (and number of atomic layers) determining the film's total thickness.

In connection with formation of a metal oxide, an ALD cycle can include the introduction of a source of metal as a precursor. This precursor is typically introduced in gaseous form, that is, in a form that readily reacts with the oxygen source. Using a Ti precursor such as titanium tetra-isopropoxide (TTIP), or specific other materials, the resultant reaction yields titanium oxide adhered to the substrate surface and byproducts such as methane, water and potentially other materials, which are pumped away. As mentioned earlier, it is believed that the use of amide-containing titanium precursors (e.g., precursors that have a nitrogen bond) inhibits anatase formation and yield a higher dielectric constant and more effective EOT.

Figure 9:
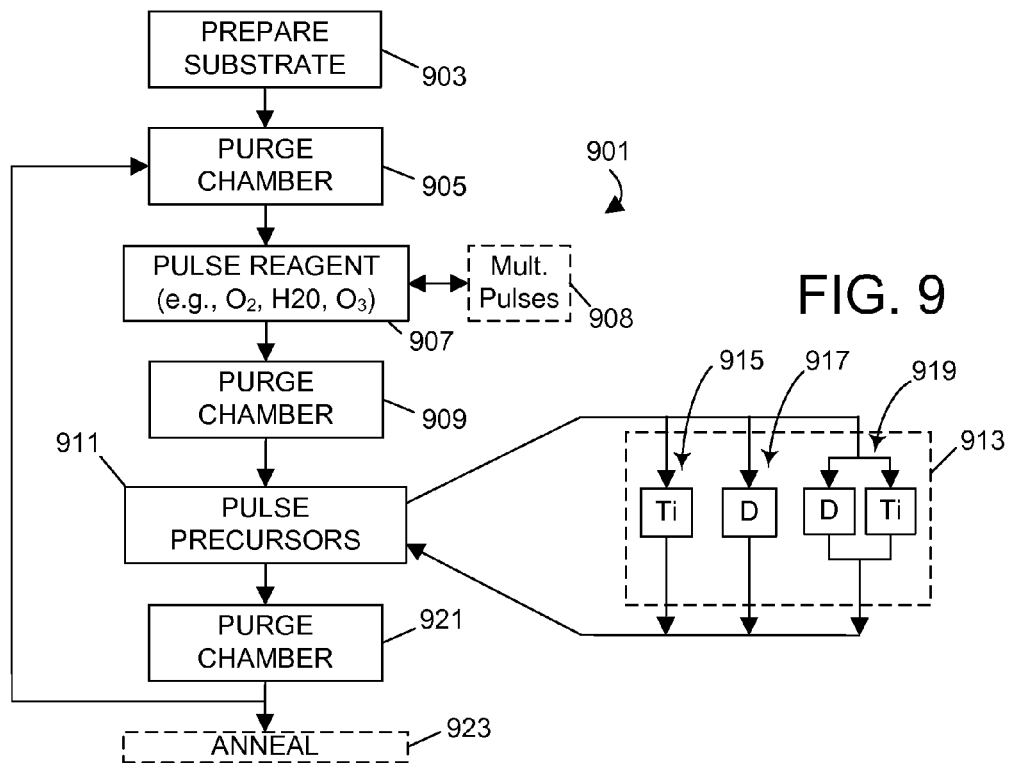
FIG. 9 is a flow chart of an embodiment that illustrates use of an ALD process to create an oxide layer using a number of ALD deposition cycles. In some embodiments, these monolayers or nanolaminates may be configured as individual depositions each involving titanium oxide; in other embodiments, certain ones of these monolayers or nanolaminates may be configured as to include dopants, such as for example, providing a nanolaminate of yttrium oxide $Y_2O_3$ or aluminum oxide $Al_2O_3$ for each 4-5 nanolaminate depositions of titanium oxide ($TiO_2$).

FIG. 9 illustrates this general method, denoted by reference numeral 901. As indicated by block 903, a substrate may first be prepared and introduced into a clean room environment. The preparation steps may be any steps suitable to the substrate and other materials at issue, for example, as may be necessary to deposit a first electrode on a substrate (e.g., a wet or dry cleaning process). The substrate may be any material suitable for use in supporting a semiconductor layer, including metal, glass, some other insulator, or another material, conventional or otherwise; generally speaking, when fabricating a MIM stack for use as an electronic component (e.g., capacitor, DRAM cell), an electrode layer is first deposited. As mentioned above, the preparation may also include a scrubbing step depending on native electrode surface, to clean, oxidize and otherwise prepare the electrode surface. Following preparation and pretreatment, air is then purged from the chamber by a vacuum process, as indicated by function block 905. A reagent (such as oxygen gas, ozone gas, water vapor, or some other oxygen source) may then be introduced to the chamber to adsorb to the surface of the substrate, per reference numeral 907; as alluded to above, the introduction of this reagent may overlap the scrubbing process, i.e., if ozone is used as the pretreatment agent and a vacuum is maintained, it may not be necessary to use further reagent for the first ALD cycle. Also, as mentioned previously, some designs may benefit from the use of multiple reagent pulses, separated if desired by a purge cycle (for example, as has been found to be the case where platinum electrodes are used). This process is indicated in FIG. 9 as a dashed-line (optional step) block 908. If necessary, the chamber is then again purged, to leave only a conformal amount of the reagent on the top surface of the substrate, as indicated by block 909. One or more titanium precursors are then introduced to the chamber to react with the oxygen source (e.g., for an exposure time of from one to ten seconds), as indicated by block 911.

As seen in the exploded detail at the right side of FIG. 9, several options exist for applying the precursor, as contained within a dashed-line block 913. For example, if the particular ALD deposition is to include only titanium oxide, a titanium precursor can be applied as one or more sequential pulses of gas, per process 915. These pulses are typically applied if desired without any intervening purge or intervening introduction of an oxygen source. Alternatively, if desired for the ALD cycle is to be used to deposit a dopant monolayer or nanolaminate, as depicted by a second process 917, a dopant material may be introduced, for example, a yttrium precursor may be introduced for the purpose of forming a nanolaminate of yttrium oxide. Finally, for some embodiments (as indicated by process 919), it may be desired to mix both titanium and dopant precursors to form a single monolayer, via a co-injection process where simultaneous or successive pulses of the respective gasses (without intervening oxygen source introduction). Each metal precursor is typically an organometallic, although inorganic substances may also be used. Once the precursor has been transferred, the reaction proceeds to consume the top layer of the deposited reagent, and then stops, with the remaining gasses being evacuated (as indicated by process block 921).

The cycle's result is an atomic layer having a thickness on the order of a fraction of an Angstrom to several Angstroms. This cycle may be then repeated as necessary to deposit any number of desired layers (e.g., forty times to produce a 2 nm thick dielectric layer for a hypothetical growth rate of 0.5 A/ALD cycle). When the dielectric layer of the appropriate thickness and metal electrode have been formed, the assembly is subjected to an anneal process in an oxygen-rich environment, identified by reference numeral 923, which further oxidizes the fabricated film to fill remaining oxygen vacancies and reduce defects in the film, as will be described below.

Figure 10:
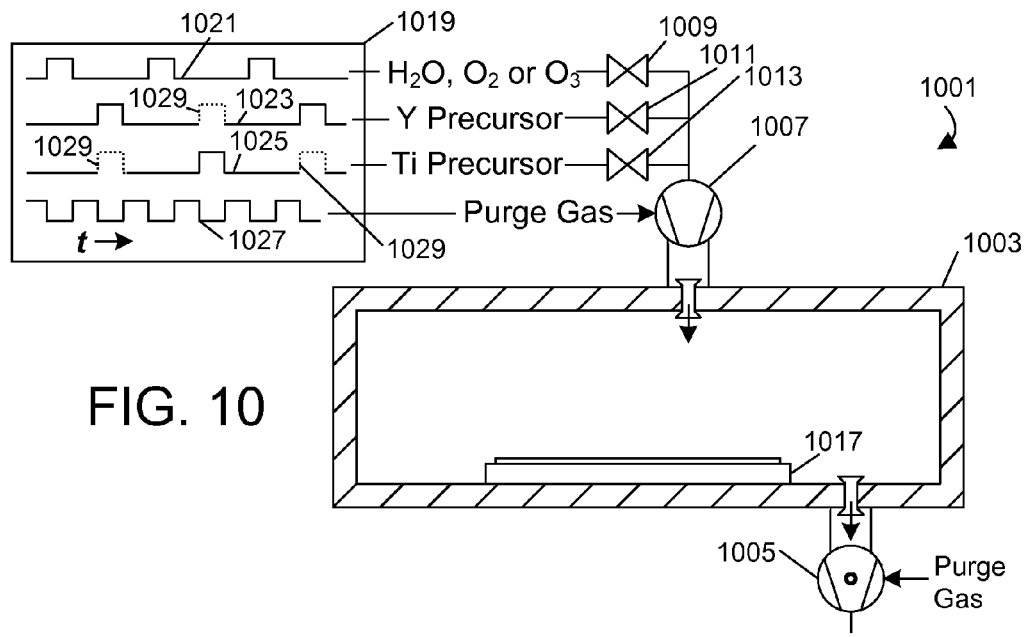
FIG. 10 is an illustrative diagram showing the layout of a vacuum chamber used in an ALD process.

FIG. 10 presents a schematic 1001 of an ALD chamber and an associated timing graph 1019 that may be used to create oxide monolayers or nanolaminates of titanium oxide, yttrium oxide or each of them. FIG. 10 shows a reaction chamber 1003 having an evacuation pump 1005 and an inlet 1007, to introduce precursors and reagents into the chamber. Three valves, 1009, 1011 and 1013 are depicted to each respectively supply a reagent (e.g., vaporized water, oxygen or ozone), a dopant precursor or a titanium precursor, as controlled by software. Each gas is selectively introduced into the chamber and forms a self-saturating nanolaminate as it flows over the substrate, which may be mounted on a suitable holder or pedestal 1017 and, if desired, may be rotated or otherwise robotically manipulated during deposition or between cycles.

The timing diagram presented at the left-hand side of FIG. 10 shows relative timing pulses that may be used in one embodiment to fabricate oxide layers of yttrium and titanium (i.e., assuming it is desired to create a titanium oxide layer doped with yttrium). In particular, a first waveform 1021 represents the timing of reagent pulses, e.g., ozone ($O_3$), oxygen gas ($O_2$), vaporized water, or some other material, as mentioned above. Second and third waveforms, 1023 and 1025, respectively represent the operation of control valves 1011 and 1013 to supply yttrium and titanium precursors (e.g., as organometallics). Finally, a final waveform 1027 represents a digital control over the purge gas functions, used to control both the injection and evacuation pumps (1005 and 1007). The process depicted in FIG. 10 may be used to introduce organometallics deposited together or sequentially without an intervening reagent and/or purge cycle. Solid lines 1023 and 1025 indicate the use of a sequential introduction of organometallics, for example, to deposit distinct nanolaminates of $TiO_2$ and $Y_2O_3$, alternating between these materials to thereby build up an aggregated oxide layer, e.g., via forty or more cycles; alternatively, as indicated by dashed line pulses 1029, injection of organometallics into the deposition chamber may in some embodiments be simultaneous, so as to deposit a number of Ti—Y—$O_x$ monolayers. Generally speaking, each monolayer or nanolaminate in these embodiments can be expected to be on the order of about ½ Angstrom thick, such that forty layers would produce an oxide layer approximately two nanometers thick. Typical oxide layers can be expected to be at least this thick, with a conventional range being on the order of 10-120 nanometers thickness.

FIG. 10 illustrates that, if desired, a sequence of monolayers or nanolaminates may be deposited by introducing a titanium precursor, an oxygen source, a yttrium precursor, an oxygen source, a titanium precursor, an oxygen source, and so-on, in a repeating manner, to deposit $TiO_2$ with occasional nanolaminate depositions of $Y_2O_3$, with intervening purge or other cycles as necessary. As alluded to earlier, other dopants such as an aluminum oxide (e.g., in doping of 1-20 atomic percentage of aluminum to total metal) may also be employed as an option.

2. Heating During the ALD Process.

Use of the mentioned precursors and reagents typically requires an appropriate temperature window to facilitate a reaction and deposit oxide monolayers or nanolaminates as appropriate. Deposition rate, that is, the rate at which layers can be formed and cycles can completed and repeated as necessary is also heavily temperature dependent. Too low a temperature (e.g., outside the window) will inhibit a reaction from proceeding, and too high a temperature (outside the window) may destroy the precursor and/or result in the deposition of undesired materials.

Figure 11:
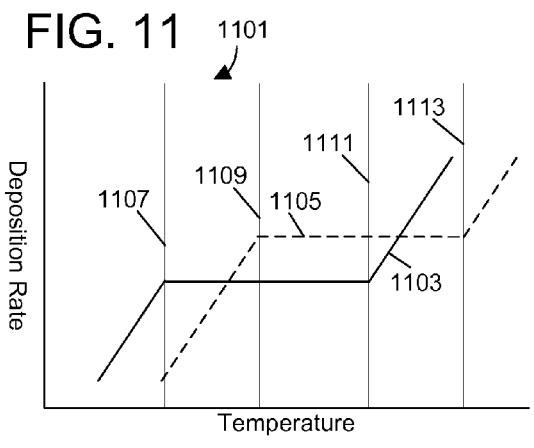
FIG. 11 is a graph 1101 of deposition rate as a function of temperature in an ALD process; each of two curves represents use of a different precursor (e.g., a first titanium precursor 1103 and a second titanium precursor or a dopant precursor 1105). The horizontal area of each curve represents an ALD process window.

FIG. 11 is a graph 1101 used to introduce temperature windows, and also a problem that can arise when multiple precursors are used in one process (e.g., a dopant precursor and a titanium precursor). The temperature window of a first precursor, e.g., an amide-containing titanium precursor, is indicated by curve 1103. A steep low temperature slope represents the area below saturation, i.e., where deposition does not proceed satisfactorily, and a steep high temperature slope represents an area where each precursor breaks down, with chemical bond separation of the precursor molecule structure becoming unpredictable (thus significantly affecting deposited dielectric layer quality).

Where multiple specific precursors are used (e.g., different titanium precursors or a titanium precursor and dopant precursor), however, temperature window management may become more complex, i.e., precursors may tend to react with oxygen sources at different temperatures. For example, if a titanium oxide dielectric layer is doped with a small amount of yttrium oxide, as individual ALD nanolaminates or monolayers dispersed within the dielectric layer structure, non-overlapping temperature windows for the different precursors can create heating issues, ultimately increasing overall ALD process time and complexity. Generally speaking, the precursor molecules are significantly more complex than pure metal titanium and metal yttrium that might be used in a PVD process; with poor choice of reaction temperature, the wrong molecule bonds might be broken, resulting in impurities in the resultant dielectric layer, and otherwise impeding the fabrication process. Generally speaking, the reaction windows (or ALD process window) for common titanium precursors and common yttrium precursors, respectively, do not substantially overlap, making it difficult to fabricate devices with both titanium and yttrium using an ALD process. To this end, specific selection of precursor combinations may be used to address these problems.

In this regard, FIG. 11 also graphs a possible temperature window for a second precursor 1105, such as a yttrium precursor, depicted using a dashed line. Through selection of specific precursors, the process windows (i.e., the horizontal areas) may be caused to overlap, facilitating deposition processes. The transitions from low temperature slopes and to high slopes for each of the precursors, respectively, are identified by reference numerals 1107, 1109, 1111 and 1113. Ideally, precursors are chosen that cause the horizontal portions of these windows to overlap in view of the reagent used for the ALD process and the desired dielectric layer material.

More specifically, the following pairs of precursor materials have been found to have overlapping ALD process windows, at the approximate processing temperatures indicated below:

(a) TTIP and tris(methylcyclopentadienyl)-yttrium ($Y(MeCp)_3$), at a temperature range of approximately 250-300 degrees Celsius;

(b) TDMAT and tris(methylcyclopentadienyl)-yttrium ($Y(MeCp)_3$), at a temperature range of approximately 250-300 degrees Celsius;

(c) TEMAT and tris(butylcyclopentadienyl)-yttrium (($BuCp)_3$)Y, at a temperature range of approximately 325-375 degrees Celsius;

(d) MeCp-TDMA and tris(methylcyclopentadienyl)-yttrium ($Y(MeCp)_3$), at a temperature range of approximately 250-300 degrees Celsius; and (e) TDEAT and tris(butylcyclopentadienyl)-yttrium (($BuCp)_3$)Y, at a temperature range of approximately 325-350 degrees Celsius.

These are not the only specific material combinations possible, but they do represent precursor combinations that should yield appropriate results and facilitate fabrication of superior dielectric layers as part of an ALD process. Importantly, deposition rates associated with these materials may vary within the listed temperature ranges; therefore, in one detailed embodiment, the precise temperature within the common process window may be varied, to provide different relative deposition rates for the listed materials. Other ways of tailoring deposition rates may include controlling the volume and/or rate of precursor or reagent supply.

As introduced earlier, the use of an amide-containing titanium precursor is believed to promote higher k value (dielectric constant) and lower EOT. It is believed that the presence of nitrogen in the molecular structure for these precursors causes the titanium bonds to separate from nitrogen and react with oxygen in a manner that is different from other precursors, such as TTIP, and that this reaction if performed at the proper temperature helps minimize the formation of anatase phase titanium oxide. As will be shown below, the absence of anatase phase titanium oxide is highly correlated with resultant dielectric constant—therefore, to maximize dielectric constant (and correspondingly, promote lower EOT), it may be important to apply a specific temperature even within the temperature windows given above. There exist many temperature control points that may be used in an ALD process; referring back to FIG. 10, for example, temperature control points may be applied to injected gasses, or to any point associated with the ALD reaction chamber 1003. In one specific implementation, fairly precise temperature control may be applied via a pedestal heating process, that is, via a heating element in the holder or pedestal 1017, to more precisely and responsively control temperature of the substrate during the ALD process.

Figure 12:
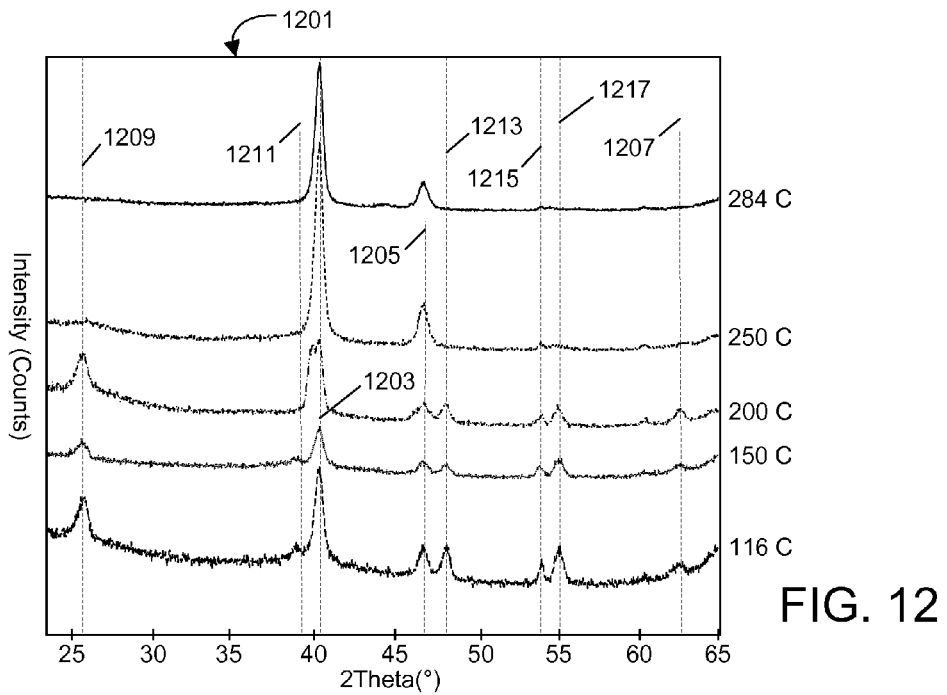
FIG. 12 is a graph 1201 showing XRAY diffraction of five different titanium oxide dielectric layers, each based on a TDMAT precursor and each having a different level of pedestal heating during the ALD process.

FIG. 12 is a graph 1201 showing XRAY diffraction of five different titanium oxide dielectric layers, each based on a TDMAT precursor and each having a different level of pedestal heating during the ALD process. Samples are represented by five X-ray diffraction plots, with the corresponding pedestal heating temperature identified at the right margin of each plot (i.e., corresponding to temperatures of 284 C, 250 C, 200 C, 150 C and 116 C). A number of dotted vertical lines 1203, 1205, 1207, 1209, 1211, 1213, 1215 and 1217 are indicated to each show diffraction peaks that indicate the presence of various crystal formations for each of the plotted samples. Lines 1203 and correspond to the use of a platinum electrode in the samples. The remaining lines, 1207, 1209, 1211, 1213, 1215 and 1217 all illustrate peaks associated with anatase phase titanium oxide.

Notably, for the bottom-most plot (pedestal temp of 116 C), depicted peaks represent the following substances (peaks given left to right in terms of approximate theta angle/plane): anatase (26°/101) 1209, anatase (39°/112) 1211, platinum (40°/111) 1203, platinum (47°/200) 1205, anatase (48°/200) 1213, anatase (53°/105) 1215, anatase (55°/211) 1217 and anatase (63°/002) 1207. The anatase phase of titanium oxide (represented by lines 1309, 1311, 1313, 1315 and 1317) is clearly represented in this data, as well as for pedestal temperatures of 150 C and 200 C. However, at a point between 200 C and 250 C, these peaks begin to disappear up through the sample predicated on a 284 C pedestal temperature.

Figure 13:
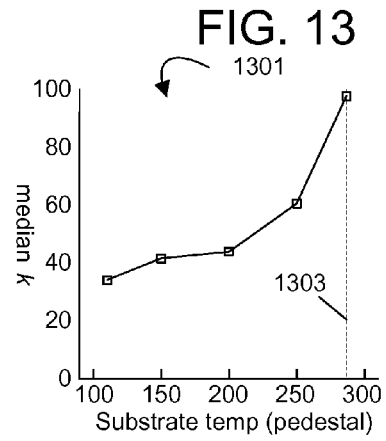
FIG. 13 plots dielectric constant for the various samples represented in FIG. 12; the highest dielectric constant is obtained for the 284 C sample, with the dielectric constant correlating with reduced presence of anatase phase titanium oxide. An inference drawn from this data is that the presence of anatase phase titanium oxide is inconsistent with the desirable properties of low EOT and leakage.

FIG. 13 shows a plot 1301 of variation of dielectric constant as a function of pedestal temperature variation for these samples. In particular, the median k value for the low temperature samples is seen to remain in the neighborhood of 40, but as temperature increases above 200 C, dielectric constant begins to rise as well; for a pedestal temperature of 250 C, a dielectric constant of approximately 60 was observed, and at 284 C the dielectric constant peaked at approximately 98. FIGS. 12 and 13, taken together, suggest that the existence of anatase phase is associated with low dielectric constant. [Anatase phase titanium oxide it will be recalled has a relatively low dielectric constant, in the range of 30-40.] With appropriate heating, e.g., above 250 C for a TDMAT based titanium oxide sample, and at or near the upper range of the ALD process window for TDMAT (e.g., at 284 C), excellent results were observed for dielectric constant. Where other titanium precursors are used (or other processes beyond ALD), the ideal pedestal temperature or temperature range can be expected to vary but be readily determinable through empirical means by one skilled in the art.

3. Deposition Rate Using Amide-Containing Precursors.

Figure 14:
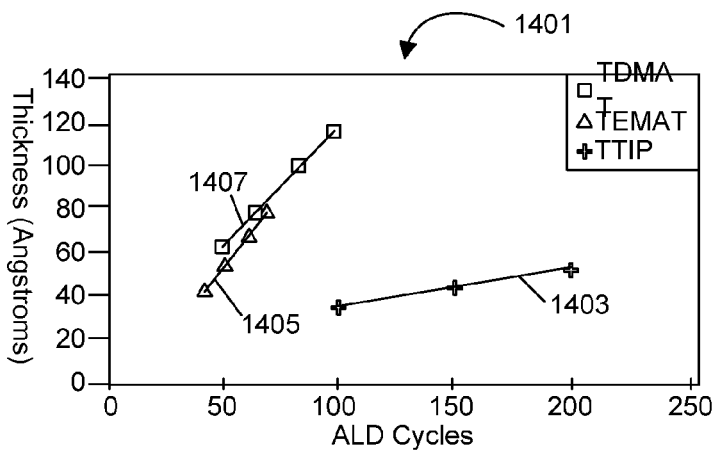
FIG. 14 presents a graph 1401 of deposition rate where TDMAT, TEMAT and TTIP are used as titanium precursors. What FIG. 14 indicates, however, is the amide-containing precursors (TDMAT and TEMAT) produces significantly better (nearly five-fold) deposition rate improvement relative to the TTIP data, leading to significantly faster dielectric formation time and, ultimately, lower manufacturing costs.

FIG. 14 presents a graph 1401 of deposition rate where TDMAT, TEMAT and TTIP are used as titanium precursors, as a function of ALD cycles. In particular, crosses and a first curve 1403 are used to represent samples obtained using TTIP, triangles and a second curve 1405 are used to represent samples based on TEMAT, and squares and a third curve 1407 are used to represent samples based on TDMAT. Each of the three curves may be modeled as an approximately straight line that intersects with the origin of FIG. 14, with the deposition rate represented by the slope of each line—for TTIP, the first curve 1403 reflects a slope of approximately 0.21 (Angstroms of layer thickness per ALD cycle), while for the TEMAT and TDMAT samples (curves 1405 and 1407, respectively), the slopes are each approximately 1.12 (Angstroms of layer thickness per ALD cycle)—representing a better than five-fold improvement in deposition rate for the amide-containing precursors relative to the non-amide-containing precursor. Generally speaking, higher deposition rates are preferred, ideally at greater than a half Angstrom per ALD cycle and if possible, greater than one Angstrom per ALD cycle.

As will be recalled from the data presented in FIG. 8, the use of amide-containing precursors promotes lower leakage characteristics—FIG. 14 indicates that the use of amide-containing precursors also promote a significantly faster deposition rate, which in turn, implies significantly lower manufacturing cost for semiconductor devices that might rely on the structures proposed by this disclosure.

4. Process Considerations—Electrode Choice and Doping.

Figure 15:
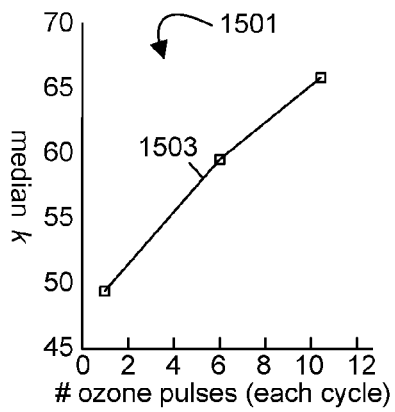
FIG. 15 presents data pertinent to the use of platinum as an electrode, and indicates that multiple reagent pulses with each ALD cycle (where platinum is used as a lower electrode) has substantial impact on improving dielectric constant.

Experiments with reagent flow rate (i.e., using ozone as the reagent) demonstrated saturation during the ALD process for low flow rates, but with data that appeared to vary in dependence on number of ozone pulses when titanium is used as the primary constituent for the bottom electrode. FIG. 15 presents a graph 1501 pertinent to the use of platinum as an electrode, and indicates that multiple reagent pulses with each ALD cycle (where platinum is used as a lower electrode) has substantial impact on improving dielectric constant. Thus, as depicted with a curve 1503, gains may be had when multiple ozone pulses are used within each ALD cycle (e.g., 10 pulses between each precursor pulse, with a flow rate of approximately 1 liter per minute). The same dependency on pulses and flow rate was not observed for MIM samples using ruthenium as a bottom electrode.

As indicated, suitable electrode materials include titanium nitride (TiN), platinum, iridium, iridium oxide, tungsten, tungsten oxide, molybdenum, molybdenum oxide, ruthenium and ruthenium oxide. Depending on implementation, the electrode may be a higher work function material, in order to provide a high-barrier height with respect to the dielectric. If appropriate to the implementation, the electrode may also be made to include an oxidation resistant material, which may be helpful if the fabrication process includes an anneal in an oxygen ambient. For example, in one embodiment, one or both electrodes (top and bottom) may be made from a high work function material such as a noble or near noble metal (i.e., a metal with a low absolute value free energy change ($|\Delta G|$) of oxide formation). Noble or near noble metals include iridium, iridium oxide, platinum, ruthenium, and ruthenium oxide. The electrodes can also be multi-layer electrodes that can include one or more different materials. For example, an electrode can include a layer of ruthenium and ruthenium oxide, or a layer of iridium, iridium oxide, or platinum with another layer of binary or ternary metal nitrides which may include TiN, TiAlN, TiSiN, TaN, TaAlN, TaSiN, WN, WSiN, WCN or similar refractory metal nitrides. A capping layer may be chosen if desired to be an oxidation resistant material. The multi-layer electrodes can be used to improve adhesion properties and performance of memory cells in some configurations and embodiments. A designer with skills in materials engineering may, as a general matter, try different materials and select appropriate materials for the particular implementation depending on design choice and the various teachings presented by this disclosure.

Figure 16:
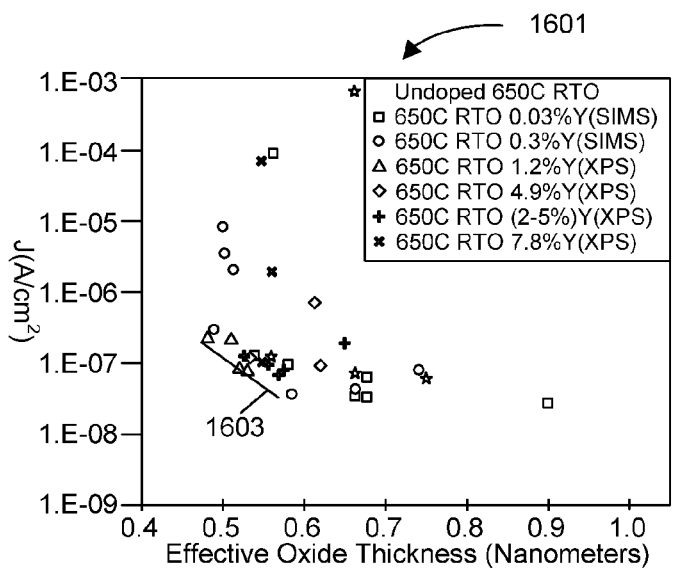
FIG. 16 is a diagram that plots leakage density and EOT for various percentages of yttrium to total metal.

FIG. 16 provides detail, showing leakage density and EOT for a titanium oxide dielectric layer with various contributions of yttrium, as a function of yttrium percentage to total metal by weight in the dielectric layer. In particular, FIG. 16 presents a graph 1601 of data for yttrium contributions of 0.00% (undoped), 0.03%, 0.3%, 1.2%, 4.9%, 2-5% and 7.8%. The yttrium proportion found to both minimize leakage density and EOT for the considered samples was approximately 1.2%. For undoped samples (represented by small stars), the leakage density and EOT were relatively high, decreasing to a near minimum for the yttrium samples of 1.2% (e.g., between one and two percent), and then increasing again as yttrium is increased above five percent (e.g., as represented by the "x" data markings in FIG. 16). The minimum seen for the presented data (i.e., as represented by the samples having 1.2% yttrium) are represented by a line denoted by numeral 1603 in FIG. 16. Thus, it is expected that a small amount of doping of the titanium oxide layer by yttrium oxide, or a similar material such as aluminum oxide (e.g., 1-20%), may yield further dielectric layer improvements and reduction in EOT. Some preliminary tests performed using aluminum oxide suggest that a suitable percentage within this range may be on the order of 5% of atomic ratio between aluminum and total metal in the dielectric layer.

5. Anneal in an Oxidizing Environment.

Figure 17:
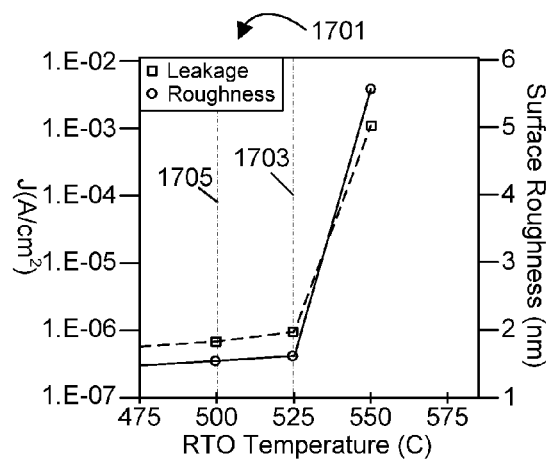
FIG. 17 charts correlation between leakage and roughness, each as a function of RTO temperature for a device having a ruthenium bottom electrode.

FIG. 17 charts correlation of leakage and roughness as a function of anneal temperature (with samples based on a ruthenium bottom electrode), with anneals being performed on the order of a few minutes. A graph 1701 shows squares for leakage and circles represent random surface roughness. As indicated by FIG. 17, the lack of random surface roughness (e.g., electrode roughness) is highly correlated with low leakage. As the anneal temperature increases too much (above 525 C for the materials that are the subject of FIG. 17), surface roughness becomes disrupted, and leakage spikes strongly.

An anneal process in an oxygen environment (e.g., RTO, or rapid thermal oxidation, or a furnace anneal) may help fill oxygen vacancies (defects) and eliminate interface states (open molecular bonds at the interface of a layer) thus promoting lower leakage characteristics. Thus, it is believed that as high a temperature as possible should be used for the anneal process, but not at a temperature high enough to damage the device being manufactured or otherwise denigrate EOT or K value. For MIM stacks based on a ruthenium bottom electrode, such a range may lie at 500 C-525 C, as represented by range lines 1703 and 1705 in FIG. 17. For use of a platinum electrode, damage to the dielectric device was observed at temperatures above 700 C, and thus a range appropriate to platinum is 550 C-650 C, and perhaps even closer to 700 C. For other materials, one skilled in the art should be able to determine appropriate temperature ranges and anneal times.

The data presented above supports the use of an ALD process as also providing superior process results for dielectric layer fabrication, particularly for oxides of yttrium and titanium and their various combinations. As further indicated by the data, the use of ozone as a reagent in these processes provides further benefits and generally produces a superior dielectric layer, relative to other oxygen sources; the use of ozone in an ALD process is seen to produce layers having better characteristics. It is believed these characteristics result from superior reactivity between ozone and the precursor species discussed in the ALD processes introduced above, in more accurately breaking the desired bonds within the precursor species at issue, and enabling conformal fabrication of oxide molecules to the underlying substrate (and any associated monolayers). While normally difficult to deposit yttrium and titanium together in a common reaction chamber because of inconsistent process windows, the selection of specific precursors as taught by this disclosure (including a titanium source provided by amide-containing titanium precursors) can enable just such a result; for dopants, if yttrium is used, an appropriate precursor may include a yttrium source selected from the group of a diketonate-based yttrium material or a cyclopentadienyl (Cp)-based yttrium material), selected to match the ALD process window for the titanium precursors process window.

With ALD processes suitable for manufacturing a superior dielectric layer and MIM structure thus described, other a number of exemplary devices based on such a structure will now be described, including a number of DRAM configurations and an array based on these DRAM devices.

V. FABRICATION OF A DRAM CELL AND ASSOCIATED MEMORY ARRAY

Figure 19:
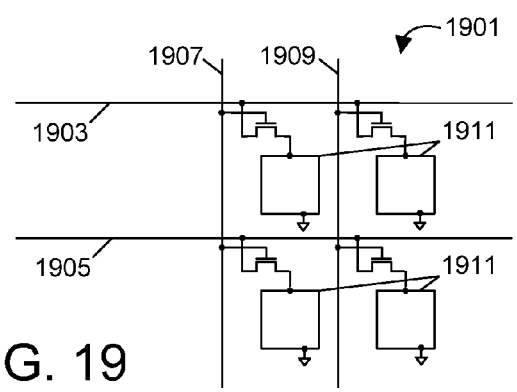
FIG. 19 shows an array of DRAM cells, each cell made using a plurality of monolayers according to the technology presented herein.
Figure 18:
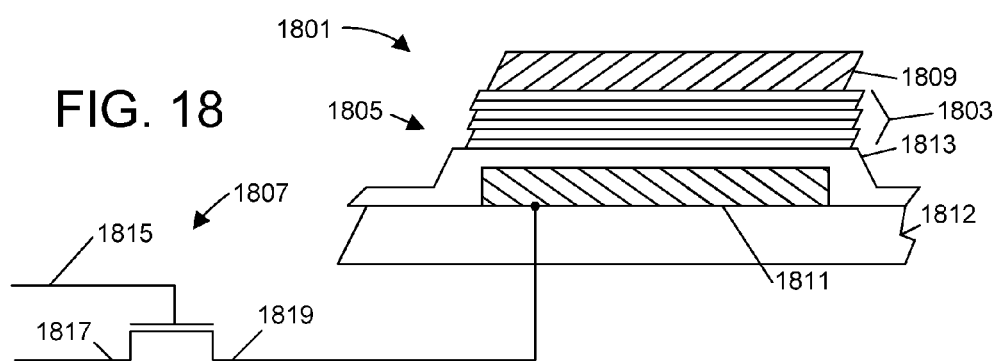
FIG. 18 is a diagram used to illustrate fabrication of a dynamic random access memory ("DRAM") cell according to the principles introduced herein.

As mentioned above, two specific applications of the principles discussed herein are to the fabrication of capacitors and to the fabrication of memory cells, including dynamic random access memory ("DRAM") cells (which form the basis for volatile memory in most contemporary computer systems). FIGS. 18 and 19 will be used for this initial discussion. DRAM memory cells use a capacitor to store charge for a period of time, with the charge being electronically "read" to determine whether a logical "one" or "zero" has been stored in the associated cell. Conventionally, a cell transistor is used to access the cell, i.e., the cell transistor is turned "on" in order to store data on each associated capacitor and is otherwise turned "off" to isolate the capacitor and preserve its charge. More complex DRAM cell structures exist, but this basic DRAM structure will be introduced below, for purposes of illustrating the application of the principles of this disclosure to capacitor manufacturing and to DRAM manufacturing. Following this introduction, several specific structures will be described, with reference to FIGS. 20-22.

FIG. 18 is used to illustrate one DRAM cell 1801, namely, one built using one or more monolayers or nanolaminates that collectively form an oxide layer, e.g., as a capacitor dielectric layer 1803. The cell 1801 is depicted to schematically include two principal components, including a cell capacitor 1805 and the cell transistor 1807 (seen at the left-hand side of FIG. 18). The cell transistor is usually constituted by a MOS transistor having gate, source and drain, the gate being connected to a word line and one of the source and drain being connected to a bit line. The cell capacitor has a lower or storage electrode and an upper or plate electrode, the storage electrode being connected to the other of the source and drain of the cell transistor and the plate electrode being connected to a reference potential wiring. The cell transistor is, when selected, turned "on" by an active level of the word line to read or write data from or into the cell capacitor via the bit line. The memory cell according to each of embodiments described herein includes a cell capacitor that includes an insulating layer (e.g., a dielectric) between two metal electrodes (storage and plate electrodes).

As was introduced earlier, the cell capacitor 1805 may include a number of layers, including two conducting layers 1809 and 1811, one of which is initially deposited or laid upon a substrate 1812, using one of many well-known processes. In the example seen in FIG. 18, the layer 1811 is used to selectively store charge to represent a logic state, i.e., it is normally electrically isolated from other components and is accessed using the cell transistor 1807. The dielectric layer 1803 helps maintain an electric field between this plate and the second conducting layer 1809, which may be connected to ground. As indicated previously, using layers made according to the process teachings explained above helps promote a higher dielectric constant with favorable leakage characteristics, and the cell 1801 depicted in FIG. 18 may therefore be made relatively smaller and be made to have a relatively thin dielectric layer. As with the case with the embodiment of FIG. 2, the layer depictions in FIG. 18 are drawn to explain principles only, and should not be understood to denote relative sizes. As is conventional, the dielectric layers formed between the conductors may include one or more other insulation layers, such as a barrier layer 1813, which may be used as a smoothing layer formed to (i) promote adhesion (depending on materials), (ii) isolate chemically, thermally or mechanically incompatible materials, or (iii) otherwise help isolate the first conducting layer 1811 of the cell capacitor. Generally speaking, this barrier layer 1813 may extend as a continuous layer to other components, for example, for use in other memory cells, or to also act as an insulator layer for the cell transistor 1807.

The cell transistor 1807 receives two inputs 1815 and 1817 from the left-hand side of FIG. 18, respectively representing column and row selection lines used to access a matrix of DRAM cells (not shown in FIG. 18). In particular, activation of a column select signal (on column selection line 1815) causes the transistor to conduct, and to electrically couple the row selection line 1817 with a drain terminal 1819 of the cell transistor, to connect the row selection line to the second conducting layer 1811 of the cell capacitor. As is known, the row line may be coupled to this conducting layer either to provide charge for storage purposes, or to "sense" the stored value of the capacitor. As is typical with DRAM devices, the cell capacitor retains charge only for a short amount of time and refresh procedures may be used if it is desired to retain charge for any significant period.

DRAM technology is relatively cheap to manufacture and usually allows a significant density to be achieved, which are primary reasons why DRAM technology is so commonly used in contemporaneous computer and other digital systems. By enabling a greater dielectric constant to be achieved, and thinner dielectric layers to be used, the principles provided by this disclosure facilitate even smaller and cheaper memory cells.

FIG. 19 illustrates a memory array 1901 formed of DRAM cells, where each cell may be (for example) identical to the cell 1801 presented in FIG. 18. While only four such cells 1911 are illustrated in FIG. 19, it should be understood that a great many cells would typically be presented on a memory device, e.g., millions. Each memory cell 1911 is accessed by a particular combination of row selection line (1903 or 1905) with column selection line (1907 and 1909); while only four address lines have been presented in FIG. 19, a great many more will typically be presented (e.g., 64 columns for memory devices that utilize a 64-bit wide parallel data bus, and a much larger number of row selection lines).

Figure 20:
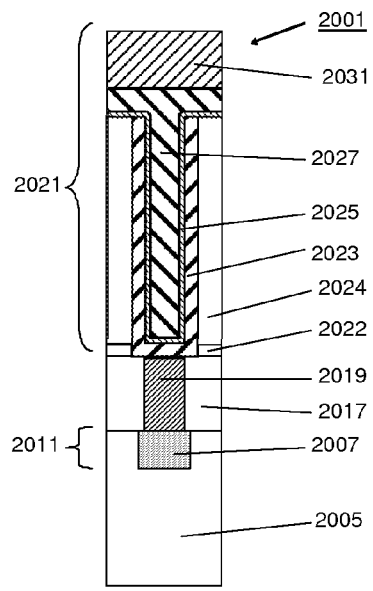
FIGS. 20-22 respectively illustrate memory cells including different capacitor configurations.
Figure 21:
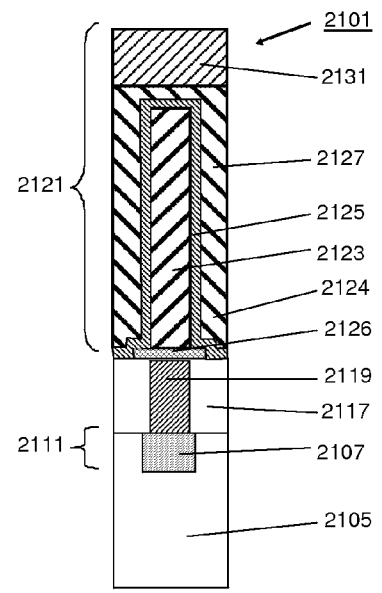
Figure 22:
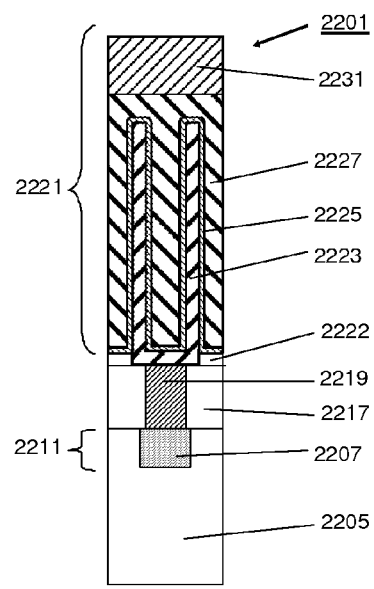

FIGS. 20-22 respectively illustrate memory cells 2001, 2101 and 2201, each illustrating different capacitor configurations. Each memory cell 2001, 2101 and 2201 is formed on a semiconductor substrate 2005, 2105 or 2205, for example, a silicon substrate. Above this substrate, a source or drain region of a cell transistor (2011, 2111 or 2211) is selectively formed. It should be noted that the gate and the other of the source and drain of the cell transistor are omitted in order to avoid the complexity of the drawings. It should be further noted that other memory cells and word and bit lines as well as memory control circuits are also not shown for the same purpose. Each cell capacitor 2021, 2121 or 2221 is formed over the substrate and is connected to the cell transistor region 2007, 2107 or 2207 through a contact plug (2019, 2119 or 2219), formed selectively in an interlayer insulating film 2017, 2117 or 2217 on the substrate. The contact plug may be made of poly-silicon and/or metal such as Tungsten, and the interlayer insulating film may be made of silicon oxide. Each capacitor 2021, 2121 or 2221 is further connected to reference potential wiring 2031, 2131 or 2231. The cell transistor of each of the memory cells is generally the same for FIGS. 20-22 and may be constituted by any one of a planer type, a recess type, a pillar type, a fin type and any other types. However, the configuration of the storage capacitors is different for each of these FIGS.; the memory cell of FIG. 20 includes a cylinder-shaped capacitor 2021, while the memory cells of FIGS. 21-22 are respectively depicted to include a pillar-shaped capacitor 2121 and a crown-shaped capacitor 2221.

FIG. 20 illustrates a memory cell 2001 having a cylinder-shaped capacitor 2021. The capacitor 2021 has cylindrical electrodes 2023 and 2027 surrounding a dielectric layer 2025. The electrodes 2023 and 2027 and dielectric layer 2025 may be formed of the materials described herein using the processes described herein.

As an example of a general process for forming a cylinder-shaped capacitor, an etching stopper film 2022 such as silicon nitride is formed on the interlayer insulating film 2017, followed by another insulating film 2024 such as silicon oxide. The film 2024 is used to determine the height of the cell capacitor 2001. Selective etching is performed on the insulating film 2024 and the stopper film 2022 to form a cylinder hole. The upper surface of the contact plug 2019 is thereby exposed. A conductive layer is then deposited inside of the cylinder hole and on the upper surface of the contact plug 2019, followed by further selective etching, such that the lower or storage electrode 2023 is formed. The dielectric layer 2025 is formed on the storage electrode 2023 and the upper surface of the insulating film 2024. The upper or plate electrode 2027 and the wiring 2031 are thereafter formed to complete the cylinder type cell capacitor.

FIG. 21 illustrates a memory cell 2101 using a pillar- or pedestal-shaped capacitor 2121. The capacitor 2121 includes a pillar-shaped bottom electrode 2123, a dielectric layer 2125, and a top electrode 2127. The dielectric layer 2125 and top or plate electrode 2127 are deposited to conform with the pillar-shaped bottom electrode 2123. As with the capacitor 2021 from FIG. 20, the electrodes 2123 and 2127, and the dielectric layer 2125 may be formed of the materials and/or the processes described herein.

As an example of a general process for forming a pillar-shaped capacitor, a metal pad 2126 such as tungsten is selectively formed to cover the upper surface of the contact plug 2119, followed by an insulating layer (not shown) deposited over the entire surface. Thereafter, a capacitor hole for each memory cell is formed in the insulating layer by selective etching, and a conductive layer is then deposited over the insulating layer to fill each capacitor hole. The CMP (Chemical Mechanical Polishing) method is then performed on the conductive layer thus deposited, so that the pillar electrode 2123 for each memory cell is formed. After removing the insulating layer, a dielectric layer 2125 is formed on each pillar electrode 2123 and the insulating film 2117, followed by the upper electrode 2127 and the wiring 2131. The pillar type cell capacitor is thus formed.

FIG. 22 illustrates a memory cell 2101 using a crown-shaped capacitor 2221. The capacitor 2221 includes a crown-shaped bottom electrode 2223, a dielectric layer 2225, and a top electrode 2227. The dielectric layer 2225 and the top electrode 2227 conform to the crown shape of the bottom electrode 2223. As with the capacitor 2021 from FIG. 20, the electrodes 2223 and 2227 and the dielectric layer 2225 may be formed of the materials and/or the processes described herein.

The methodology for forming a crown-shaped capacitor may be similar to that depicted in FIG. 20, i.e., a lower or storage electrode for each memory cell can be first formed using etching stopper 2022 and an interlayer insulating film 2024 (see, e.g., FIG. 20). The insulating film is then, however, removed. As depicted in FIG. 22, a dielectric layer 2225 can then be deposited above the lower or storage electrode 2223, to form the crown shape. The upper or plate electrode 2227 and the wiring 2231 are then formed to complete the formation of the crown-shaped cell capacitor.

Although cylinder-, pillar-, and crown-shaped storage capacitors are described above, it is understood that these descriptions are given only as examples, and that the materials and processes described herein can be used to form any style of type of memory storage device.

VI. CONCLUSION

What has been described are methods of fabricating a dielectric layer, namely, a stack of one or more layers which can be used as part of a capacitive device, memory device or similar structure. A specific material has been presented for use as a dielectric, enabling smaller and more efficient capacitors, memory devices and other structures to be constructed, characterized by high dielectric constant and excellent leakage characteristics. In addition, specific manufacturing processes have been presented, including the use of processes that use specific titanium sources to create a dielectric layer and devices having improved characteristics; as an example, by using specific precursor materials in an ALD process, a pretreatment process and an oxidizing anneal, one may fabricate improved devices. Other applications will readily occur to those having skill in the art in view of the teachings provided above, or in view of the invention defined by the claims set forth below.

In addition, while not specifically claimed in the claim section, the applications reserve the right to include in the claim section at any appropriate time the following methods, systems and apparatuses:

[AA01]. A method of forming at least part of a metal-insulator-metal stack, comprising:
depositing a metal on a substrate, the metal to serve as at least part of a first electrode;
pretreating a surface of the metal with an oxidizer;
using an atomic layer deposition process to form a dielectric layer above the surface of the metal, the dielectric layer including titanium oxide, including using an amide-containing titanium precursor and an oxygen source reagent to form the titanium oxide; and
annealing at least the dielectric layer;
where the dielectric layer is characterized as having substantially no x-ray diffraction peak associated with anatase titanium dioxide.

[AA02]. The method of claim [AA01], where:
using an amide-containing titanium precursor includes using tetrakis dimethylamino titanium (TDMAT); and
heating the substrate includes providing a temperature from the range of 250-300 degrees Celsius.

[AA03]. The method of claim [AA02], where providing a temperature includes using pedestal heating and providing a temperature from the range of 275-300 degrees Celsius.

[AA04]. The method of claim [AA01], where:
using an amide-containing titanium precursor includes using tetrakis (ethylmethylamino) titanium (TEMAT); and
heating the substrate includes providing a temperature from the range of 325-375 degrees Celsius.

[AA05]. The method of claim [AA01], where:
using an amide-containing titanium precursor includes using tetrakis (diethylamino) titanium (TDEAT); and
heating the substrate includes providing a temperature from the range of 250-350 degrees Celsius.

[AA06]. The method of claim [AA01], where using includes heating the substrate using a pedestal heating process to heat the substrate to a temperature between 280-290 degrees Celsius.

[AA07]. The method of claim [AA01], where depositing a metal on a substrate to serve as a first electrode includes depositing one of ruthenium or platinum.

[AA08]. The method of claim [AA01], where pretreating the surface includes treating the surface using ozone.

[AA09]. The method of claim [AA01], further comprising using multiple oxygen source pulses for each cycle of the atomic layer deposition process.

[AA10]. The method of claim [AA01], further comprising using ozone as the oxygen source reagent and using multiple ozone pulses between titanium precursor pulses, the multiple ozone pulses separated by respective intervening purge cycles.

[AA11]. The method of claim [AA01], where annealing includes applying an oxidizing process at a temperature of at least 400 degrees Celsius.

[AA12]. The method of claim [AA01], where annealing includes applying an oxidizing process at a temperature of at least 550 degrees Celsius.

[AA13]. The method of claim [AA01], where depositing the metal includes depositing platinum and where using an atomic layer deposition process includes using ozone and includes applying multiple ozone pulses for each of plural atomic layer deposition cycles.

[AA14]. The method of claim [AA01], where using an amide-containing titanium precursor and an oxygen source reagent includes generating an average deposition rate of at least one-half Angstrom per atomic layer deposition process cycle.

[AA15]. The method of claim [AA01], where using an amide-containing titanium precursor and an oxygen source reagent includes generating an average deposition rate of at least one Angstrom per atomic layer deposition process cycle.

[AA16]. The method of claim [AA01], where the metal-insulator-metal stack is characterized as having a leakage of less than 100 nanoamps per square centimeter when measured at 1.0 Volts.

[AB01]. A method of forming at least part of a metal-insulator-metal stack, comprising:
depositing a metal selected from a group of platinum or ruthenium on a substrate, the metal to serve as at least part of a first electrode;
pretreating a surface of the metal with an oxidizer;
using an atomic layer deposition process to form a dielectric layer above the surface of the metal, the dielectric layer consisting primarily of titanium oxide, where using includes using an amide-containing titanium precursor and an oxygen source reagent to form the titanium oxide, the amide-containing precursor selected form the group consisting of tetrakis dimethylamino titanium (TDMAT), tetrakis (diethylamino) titanium (TDEAT), or tetrakis (ethylmethylamino) titanium (TEMAT), and where using includes applying multiple ozone pulses between each precursor pulse for each of plural atomic layer deposition process cycles, the multiple ozone pulses separated by intervening purge pulses; and
annealing at least the dielectric layer using an oxidizing process and a temperature of at least 400 degrees Celsius.

[AB02]. The method of claim [AB01], where:
    pretreating the surface includes using the oxidizer to oxidize the surface of the metal; and
        using includes pedestal heating the substrate during the atomic layer deposition process to between 275-300 degrees Celsius during the deposition process.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

We claim:

1. A method of forming a capacitor stack, the method comprising:
    forming an electrode on a substrate;
    pretreating a surface of the electrode with an oxidizer;
    forming a dielectric layer above the surface of the electrode using an ALD process, the dielectric layer including a titanium oxide with a dopant metal oxide included therein, where the ALD process comprises using an amide-containing titanium precursor and an oxygen source reagent to form the titanium oxide, annealing at least the dielectric layer; and
    forming a second electrode above the dielectric layer;
    wherein dopant metal oxide is yttrium oxide;
    the method further comprising the introduction of a yttrium precursor during the ALD process;
    wherein the yttrium precursor is introduced as a separate step in the ALD deposition process than the introduction of the amide-containing titanium precursor step; and
    wherein the yttrium oxide is present in an amount of between about 1% and about 2%.

2. The method of claim 1 wherein the yttrium precursor is selected from the group of diketonate-based yttrium material or a cyclopentadienyl (Cp)-based yttrium material.

3. The method of claim 1 wherein the amide-containing titanium precursor is selected form the group consisting of tetrakis dimethylamino titanium (TDMAT), tetrakis (diethylamino) titanium (TDEAT), or tetrakis (ethylmethylamino) titanium (TEMAT).

* * * * *